(12) United States Patent
Zhou (10) Patent No.: US 10,290,665 B2
(45) Date of Patent: May 14, 2019

(54) ARRAY SUBSTRATES, DISPLAY DEVICES, AND THE MANUFACTURING METHODS THEREOF

(71) Applicant: Shenzhen China Star Optoelectronics Technology Co., Ltd., Shenzhen, Guangdong (CN)

(72) Inventor: Xingyu Zhou, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 48 days.

(21) Appl. No.: 15/533,019

(22) PCT Filed: May 12, 2017

(86) PCT No.: PCT/CN2017/084133
§ 371 (c)(1),
(2) Date: Jun. 3, 2017

(87) PCT Pub. No.: WO2018/188146
PCT Pub. Date: Oct. 18, 2018

(65) Prior Publication Data
US 2018/0294292 A1 Oct. 11, 2018

(30) Foreign Application Priority Data

Apr. 10, 2017 (CN) .......................... 2017 1 0229051

(51) Int. Cl.
*H01L 29/12* (2006.01)
*H01L 29/786* (2006.01)
(Continued)

(52) U.S. Cl.
CPC ........ *H01L 27/1288* (2013.01); *H01L 27/124* (2013.01); *H01L 27/1255* (2013.01);
(Continued)

(58) Field of Classification Search
None
See application file for complete search history.

(56) References Cited

U.S. PATENT DOCUMENTS

2005/0042524 A1* 2/2005 Bellman ................. C23C 26/00
430/5
2010/0117079 A1* 5/2010 Miyairi ............... H01L 27/1225
257/43

(Continued)

FOREIGN PATENT DOCUMENTS

| CN | 104716091 A | 6/2015 |
| CN | 105810693 A | 7/2016 |
| CN | 106024838 A | 10/2016 |

*Primary Examiner* — Calvin Y Choi
(74) *Attorney, Agent, or Firm* — Andrew C. Cheng (57) ABSTRACT

The present disclosure relates to an array substrate, a display device, and the manufacturing method thereof. The array substrate includes a substrate, and a first gate electrode layer, a first insulation layer, a trench layer, a source/drain electrode layer, a second insulation layer, a pixel electrode layer and a second gate electrode layer formed on the substrate in sequence. The pixel electrode layer and the second gate electrode layer are spaced apart from each other. The second gate electrode layer, the first gate electrode layer, and the source/drain electrode layer form at least one thin film transistor (TFT) having a dual-gate structure. With such configuration, the driving forces of the array substrate may be greatly enhanced.

12 Claims, 6 Drawing Sheets

(51) Int. Cl.
*H01L 27/12* (2006.01)
*H01L 29/423* (2006.01)
G02F 1/1368 (2006.01)
H01L 27/32 (2006.01)

(52) U.S. Cl.
CPC .. *H01L 29/42384* (2013.01); *H01L 29/78672* (2013.01); *G02F 1/1368* (2013.01); *G02F 2001/13685* (2013.01); *H01L 27/3262* (2013.01); *H01L 27/3265* (2013.01)

(56) References Cited

U.S. PATENT DOCUMENTS

| | | | |
|---|---|---|---|
| 2010/0279474 A1* | 11/2010 | Akimoto | H01L 29/7869 438/158 |
| 2013/0146876 A1* | 6/2013 | Qin | H01L 27/1255 257/59 |
| 2015/0270408 A1 | 9/2015 | Song | |
| 2017/0133446 A1 | 5/2017 | Hsu | |
| 2017/0154773 A1 | 6/2017 | Zhou et al. | |
| 2017/0162708 A1 | 6/2017 | Ge | |

* cited by examiner

ARRAY SUBSTRATES, DISPLAY DEVICES, AND THE MANUFACTURING METHODS THEREOF

BACKGROUND OF THE INVENTION

1. Field of the Invention

The present disclosure relates to flat display technology, and more particularly to an array substrate, a display device, and the manufacturing method thereof.

2. Discussion of the Related Art

Flat displays typically are characterized by attributes including thin, power-saving, and low radiation, and thus have been widely adopted. Currently, flat displays include liquid crystal displays (LCDs) and Organic Light Emitting Displays (OLEDs). Compared to the LCD, the performance of Active-matrix organic light emitting diodes (AMOLEDs) is better with respect to the power consumption, saturation, contrast, and flexible applications.

With the demand toward high-resolution has been increased, the dimension of the pixel electrode within the AMOLED is designed to be smaller and smaller, which results in a low driving capability. Under the circumstance, the conductive capability of the conductive trench of the active layer within the TFT has to be enhanced. Conventionally, such issue is solved by increasing the dimension of the gate of TFT or by adopting dual-gate TFTs. In particular, the dual-gate TFT solution has been greatly adopted for the reasons that the aperture rate of the array substrate may remain the same and the conductive capability of the conductive trench may be enhanced at the same time. However, the manufacturing process of the dual-gate TFT may consume a plurality of masks for the corresponding patterning processes, and thus the cost is high.

SUMMARY

The present disclosure relates to an array substrate, a display device, and the manufacturing method thereof. The dual-gate TFT may be formed with the enhanced driving forces of the array substrate, while the manufacturing process remains the same.

In one aspect, a display device includes: an array substrate includes: a substrate, and a first gate electrode layer, a first insulation layer, a trench layer, a source/drain electrode layer, a second insulation layer, a pixel electrode layer and a second gate electrode layer formed on the substrate in sequence, and the pixel electrode layer and the second gate electrode layer being spaced apart from each other; wherein the second gate electrode layer, the first gate electrode layer, and the source/drain electrode layer form at least one thin film transistor (TFT) having a dual-gate structure; the second gate electrode layer connecting to the first gate electrode layer via through holes of the first insulation layer and the second insulation layer; the trench layer comprising a semiconductor layer and a P-type silicon-doped layer.

In another aspect, an array substrate includes: a substrate; a first gate electrode layer covered the substrate; a first insulation layer covered the first gate electrode layer; a trench layer formed on the first insulation layer; a source/drain electrode layer formed on the trench layer; a second insulation layer covered the first insulation layer, the source/drain electrode layer and the trench layer; a pixel electrode layer and the second gate electrode layer being configured to be spaced apart from each other on the second insulation layer; wherein the second gate electrode layer, the first gate electrode layer, and the source/drain electrode layer form at least one thin film transistor (TFT) having a dual-gate structure.

In another aspect, a manufacturing method of array substrates includes: forming a first gate electrode layer and a first insulation layer on a substrate in sequence; forming a trench layer on the first insulation layer; forming a source/drain electrode layer and a second insulation layer on the trench layer in sequence; forming a pixel electrode layer and a second gate electrode layer on the second insulation layer, the pixel electrode layer and the second gate electrode layer are spaced apart from each other, wherein the second gate electrode layer, the first gate electrode layer, and the source/drain electrode layer form at least one thin film transistor (TFT) having the dual-gate structure.

In view of the above, by configuring the second gate electrode layer on the second insulation layer, the second gate electrode layer, the first gate electrode layer, and the source/drain electrode layer form the TFT having the dual-gate structure. As the second gate electrode layer and the pixel electrode layer are on the second insulation layer, the second gate electrode layer standing alone may be excluded. Thus, the TFT having the dual-gate structure may be formed without the additional manufacturing process, which increases the driving forces of the array substrate.

DETAILED DESCRIPTION OF THE EMBODIMENTS

Embodiments of the invention will now be described more fully hereinafter with reference to the accompanying drawings, in which embodiments of the invention are shown.

Figure 1:
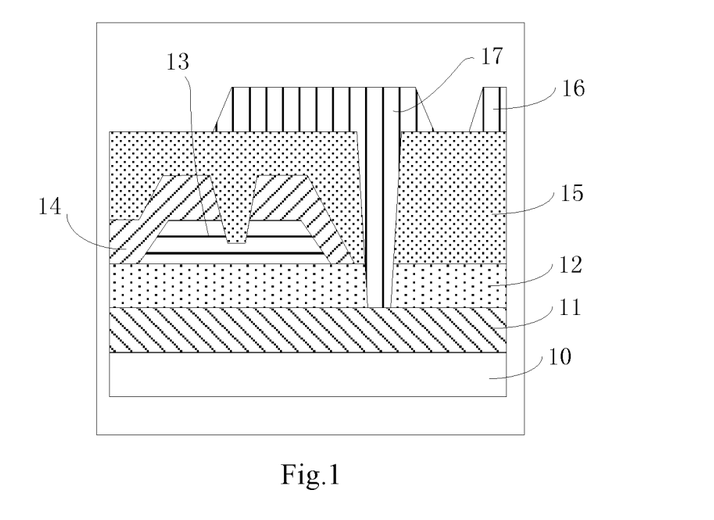
FIG. 1 is a schematic view of the array substrate in accordance with one embodiment of the present disclosure.

FIG. 1 is a schematic view of the array substrate in accordance with one embodiment of the present disclosure. The array substrate includes a substrate 10, a first gate electrode layer 11 formed on the substrate 10, a first insulation layer 12 covered the first gate electrode layer 11, a trench layer 13 formed on the first insulation layer 12, a source/drain electrode layer 14 formed on the trench layer 13, a second insulation layer 15 covered the 12 covered the 12, the source/drain electrode layer 14, and the trench layer 13; and a pixel electrode layer 16 and a second gate electrode layer 17 formed on the second insulation layer 15. The pixel electrode layer 16 and the second gate electrode layer 17 are spaced apart from each other. The second gate electrode layer 17, the first gate electrode layer 11, and the source/drain electrode layer 14 form the dual-gate thin film transistor (TFT).

The substrate 10 may be a glass substrate or a flexible substrate. In some scenarios, the substrate 10 may be a SiO2 substrate, or a Polyvinyl chloride (PV), a Polytetrafluoro ethylene (PFA), or a Polyethylene terephthalate (PET) substrate. The first gate electrode layer 11 may be a single metallic layer or a compound metallic layer, including Cr, Mo, Mo/Al, MoTi, or Cu. The first insulation layer 12 may be $SiO_x$ or $SiN_x$. In other examples, the first insulation layer 12 may be made by other insulation materials. The trench layer 13 may be a semiconductor layer made by amorphous silicon materials. In some examples, the trench layer 13 may be made by at least one of indium oxide, zinc oxide, tin oxide, gallium oxide, and the like. In other embodiments, Solid Phase Crystallization (SPC) may be adopted to transform the amorphous silicon material into polysilicon material via heat-related processes. The source/drain electrode layer 14 are configured to be a first and a second portions spaced apart from each other, and the two portions are arranged on two ends of the trench layer 13 along a vertical direction. The first portion and the second portion respectively overlap with the trench layer 13 partially, and thus the source and the drain may be deemed as two electrodes.

With such configuration, as the second gate electrode layer 17 and the pixel electrode layer 16 are arranged on the second insulation layer 15, that is, the second gate electrode layer 17 and the pixel electrode layer 16 are on the same layer, and thus the additional second gate electrode layer may be excluded. The dual-gate TFT may be formed without including additional manufacturing process, which greatly increases the driving forces of the array substrate.

Further, the second gate electrode layer 17 may connect to the first gate electrode layer 11 via the through holes of the first insulation layer 12 and the second insulation layer 15 to form the dual-gate TFT, wherein the second gate electrode layer 17 may be the pixel electrode layer made by semiconductor materials, such as Indium tin oxide (ITO), and the second gate electrode layer 17 operates as a top gate of the TFT. The first gate electrode layer 11 operates as a bottom gate of the TFT. The first gate electrode layer 11 and the source/drain electrode layer 14 form the dual-gate structure. In particular, with respect to the TFT, the first gate electrode layer 11 and the second gate electrode layer 17 are electrodes having the same potential, that is, the first gate electrode layer 11 and the second gate electrode layer 17 may be viewed as the conductive structures connected with each other. It can be understood that the second gate electrode layer 17 and the first gate electrode layer 11 may form the dual-gate structure by other ways.

Figure 2:
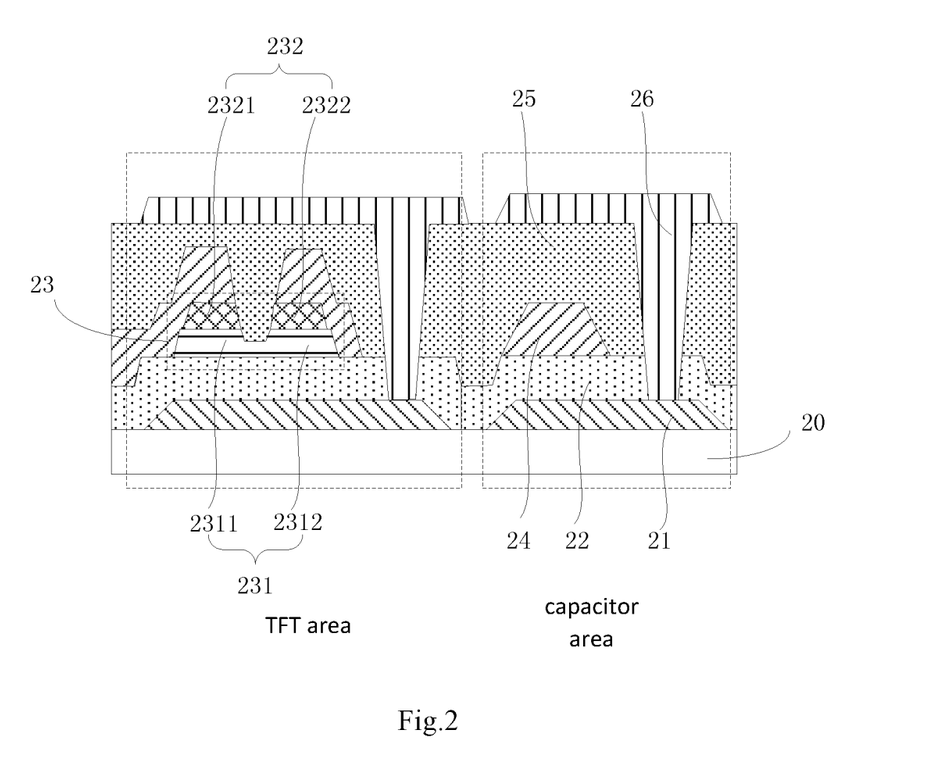
FIG. 2 is a schematic view of the array substrate in accordance with another embodiment of the present disclosure.

FIG. 2 is a schematic view of the array substrate in accordance with another embodiment of the present disclosure. As shown in FIG. 2, the TFT area is defined by the dashed lines. The trench layer 23 includes a semiconductor layer 231 formed on a first insulation layer 22 and a P-type silicon-doped layer 232 formed on the semiconductor layer 231. The semiconductor layer 231 includes a first semiconductor layer 2311 and a second semiconductor layer 2312. A first side of the first semiconductor layer 2311 connects with a first side of the second semiconductor layer 2312 facing toward the first insulation layer 22, and a second side of the first semiconductor layer 2311 and a second side of the second semiconductor layer 2312 are spaced apart from each other. The P-type silicon-doped layer 232 includes a first P-type silicon-doped layer 2321 and a second P-type silicon-doped layer 2322 spaced apart from each other. The first P-type silicon-doped layer 2321 covers the first semiconductor layer 2311, and the second P-type silicon-doped layer 2322 covers the second semiconductor layer 2312.

The semiconductor layer 231 may be P—Si, and is transformed from a-Si via Solid Phase Crystallization (SPC). The P-type silicon-doped layer 232 may be P—Si. The Boron implantation is applied toward the a-Si layer to form the a-Si doped with the Boron, and the SPC solution is adopted to transform the a-Si into P—Si doped with the Boron. As the resistivity of the p-type silicon after being doped is smaller and the conduction is easy, the first P-type silicon-doped layer 2321 and the second P-type silicon-doped layer 2322 are configured to be spaced apart to prevent the conduction therebetween.

As shown in FIG. 2, with respect to the capacitance area defined by the dashed lines, the array substrate further includes a first metallic layer 21 and a second metallic layer 21, a first insulation layer 22 covered the substrate 20, a second metallic layer 24 formed on the first insulation layer 22 and covered with a second insulation layer 25, and a third metallic layer 26 formed on the second insulation layer 25. The third metallic layer 26 connects to the second metallic layer 21 via the first insulation layer 22 and the second insulation layer 25. The second metallic layer 21, the second metallic layer 24, and the third metallic layer 26 formed capacitors of three layers, and the capacitors are connected in parallel.

In view of the above, the capacitors of three layers connected in parallel are formed while additional manufacturing process is excluded. The capability of the capacitors may be enhanced. Further, the dimension of the capacitors is reduced, which increases the aperture rate.

Figure 3:
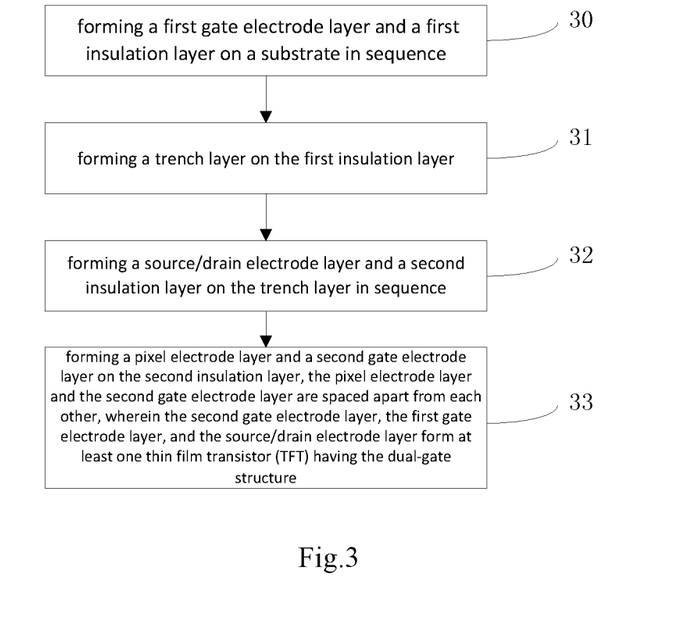
FIG. 3 is a flowchart illustrating the manufacturing method of the array substrates in accordance with one embodiment of the present disclosure.

FIG. 3 is a flowchart illustrating the manufacturing method of the array substrates in accordance with one embodiment of the present disclosure. The method includes the following steps.

In step S30, forming a first gate electrode layer and a first insulation layer on a substrate in sequence.

Figure 4:
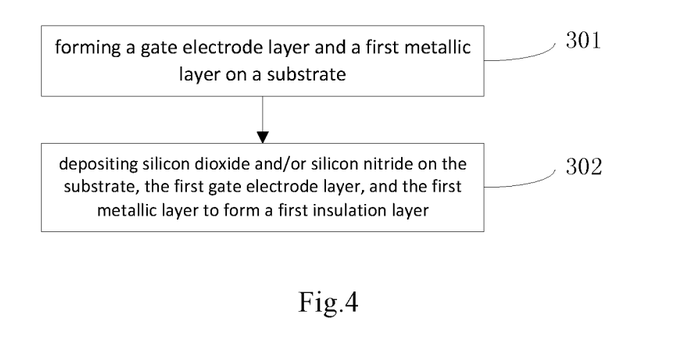
FIG. 4 is a schematic view showing the step S30 in FIG. 3.
Figure 5:
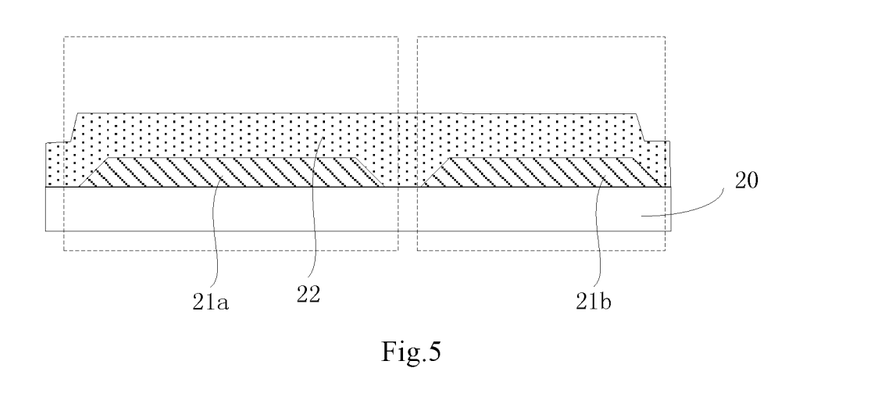
FIG. 5 is a schematic view of the array substrate in FIG. 4.

As shown in FIGS. 4 and 5, the step S30 further includes the sub-steps, including steps S301 and S302.

In step S301, forming a gate electrode layer and a first metallic layer on a substrate.

In step S302, depositing silicon dioxide and/or silicon nitride on the substrate, the first gate electrode layer, and the first metallic layer to form a first insulation layer.

The substrate may be made by transparent materials, such as glass substrates, silica substrates. In some examples, the substrate may be made by polyvinyl chloride (PV), Polytetrafluoro ethylene (PFA), Polyethylene terephthalate (PET).

The sub-step S301 includes: depositing a metallic layer on the substrate 20, and forming a first gate electrode layer 21a and a first metallic layer 21b having a predetermined pattern by photoresist coating, exposure, development, etching, and photoresist peeling.

The sub-step S302 includes: adopting CVD and yellow-ray etching process to deposit SiO2 or SiNx of single layer or of dual layers so as to form the first insulation layer 22 covering the substrate 20, the first gate electrode layer 21a, and the first metallic layer 21b.

In other embodiments, before the first gate electrode layer 21a and the first metallic layer 21b are formed, a buffering layer (not shown) having a predetermined thickness is deposited on the substrate 20. The material may be the above-mentioned SiO2/SiNx of single layer or of dual layers. In this way, the degree of adhesion between the first gate electrode layer and the substrate may be enhanced, and the heat conduction effect may be reduced.

In other examples, the first gate electrode layer 21a, the first metallic layer 21b, and the first insulation layer 22 may be formed by other methods, such as spraying.

In step S31, forming a trench layer on the first insulation layer.

Figure 6:
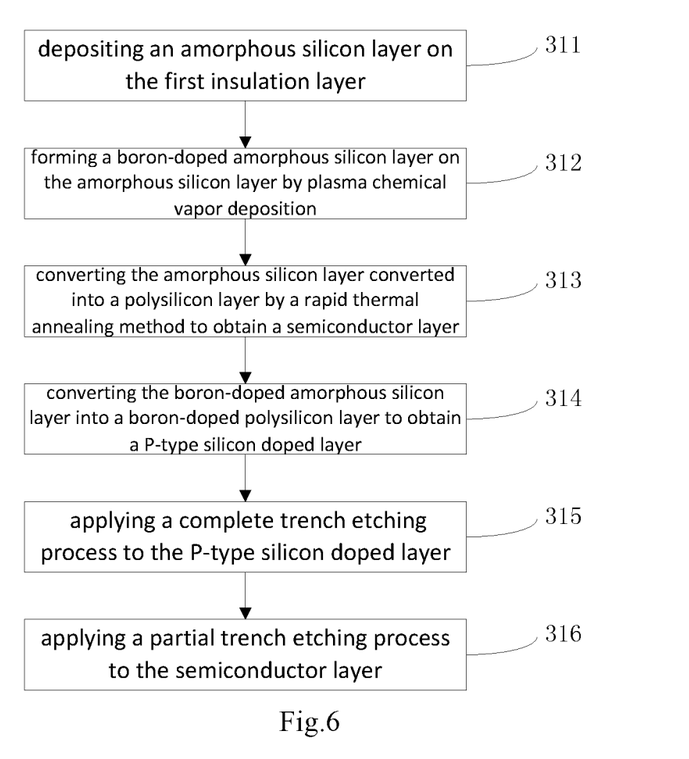
FIG. 6 is a schematic view showing the step S31 in FIG. 3.

The trench layer further includes a semiconductor layer and a P-type silicon doped layer. As shown in FIG. 6, the step S31 further includes the sub-steps:

In step S311, depositing an amorphous silicon layer on the first insulation layer.

In step S312, forming a boron-doped amorphous silicon layer on the amorphous silicon layer by plasma chemical vapor deposition.

In step S313, converting the amorphous silicon layer converted into a polysilicon layer by a rapid thermal annealing method to obtain a semiconductor layer.

In step S314, converting the boron-doped amorphous silicon layer into a boron-doped polysilicon layer to obtain a P-type silicon doped layer.

In step S315, applying a complete trench etching process to the P-type silicon doped layer.

In step S316, applying a partial trench etching process to the semiconductor layer.

The sub-steps S311-S312 includes: applying the CVD process to continuously deposit the a-Si layer on the first insulation layer, and applying the CVD process to input the B2H6 air to the a-Si layer. As such, the a-Si layer doped with a layer of Boron is formed on the amorphous layer. Further, the boron ion (B+) can also be doped on the amorphous silicon layer (a-Si) by adding a diborane (B2H6) gas source to form a amorphous silicon layer (a-Si) doped with Boron.

The sub-steps S313-S314 includes: adopting the Solid Phase Crystallization (SPC) process to convert the a-Si layer to the p-Si layer so as to form the semiconductor layer. At the same time, the a-Si layer doped with the Boron is converted to the p-Si layer doped with Boron to obtain the P-type silicon doped layer. For instance, the rapid thermal annealing (RTA) is adopted to heat up the assemblies under the condition having a temperature in a range from 670-730° C. for 10-30 minutes, and conducting a rapid cooling down process. In this way, the internal structure of the metal may reach or may be close to a balanced state, which means a better performance and capability.

The sub-steps S313 and S314 include: defining an active region by using yellow rays, applying the operations, including coating, softening, exposure, development, and hard roasting to the polysilicon layer to define a specific pattern. Further, since the conductivity of the P-type silicon doped layer is changed due to the addition of a dopant, such as boron, the resistivity becomes small and the conduction is easy. Thus, the P-type silicon doped layer must be completely etched to form a channel. The polysilicon layer is a semiconductor between the conductor and the insulator. Thus, the etching process may be applied partially to form a portion of the trench.

In step S32, forming a source/drain electrode layer on the trench layer, and forming a second insulation layer in sequence.

Figure 7:
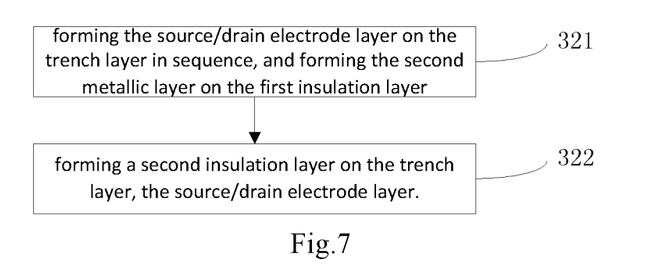
FIG. 7 is a schematic view showing the step S32 in FIG. 3.
Figure 8:
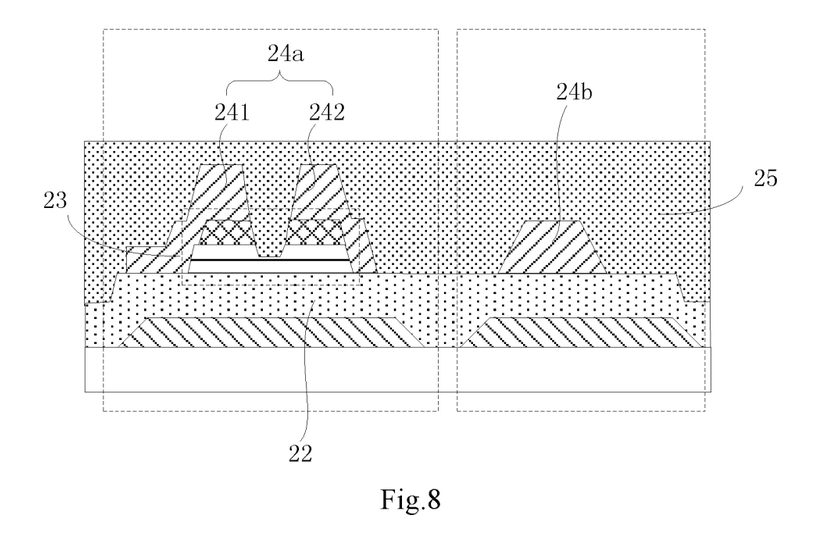
FIG. 8 is a schematic view of the array substrate in FIG. 7.

As shown in FIGS. 7 and 8, the step S32 further includes the sub-steps:

In step S321, forming the source/drain electrode layer on the trench layer in sequence, and forming the second metallic layer on the first insulation layer.

In step S322, forming a second insulation layer on the trench layer, the source/drain electrode layer.

The step S321 includes: forming the first gate electrode layer and the first metallic layer as described above, and depositing a metallic layer on the trench layer 23 to form the source/drain electrode layer 24a and to form the second metallic layer 24b on the first insulation layer 22. In addition, performing the etching process according to the defined area to from the trench so as to define the source 241 and the drain 242. When the source and the drain of the TFT is symmetrical to each other, and the source and the drain may be viewed as two electrodes integrally formed.

The sub-step S322 includes: forming the second insulation layer 25 on the trench layer 23, the source/drain electrode layer 24a, and the second metallic layer 24b.

In other embodiment, after the trench layer is formed on the first insulation layer, an active layer is defined by the yellow rays. The SD metal is deposited on the trench layer to form the source/drain electrode layer. Applying the etching process according to the defined area to define the source and the source. Afterward, the etching process is applied to the P-type silicon-doped layer and the semiconductor layer above the trench.

In step S33, forming a pixel electrode layer and a second gate electrode layer on the second insulation layer, and the pixel electrode layer and the second gate electrode layer are spaced apart from each other. The second gate electrode layer, the first gate electrode layer, and the source/drain electrode layer form the TFT of the dual-gate structure.

Figure 9:
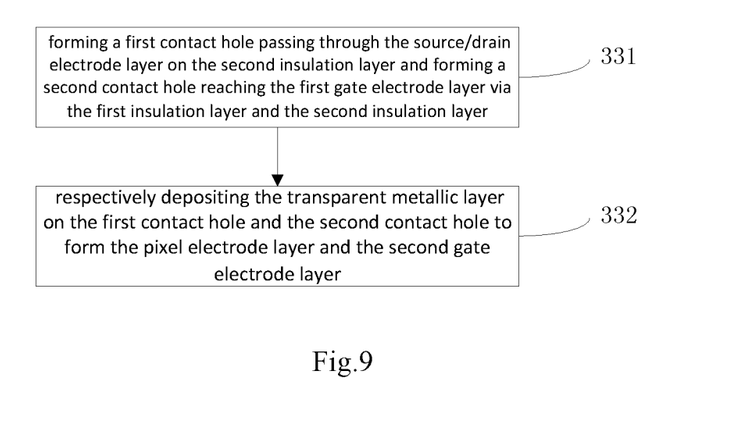
FIG. 9 is a schematic view showing the step S33 in FIG. 3.
Figure 10:
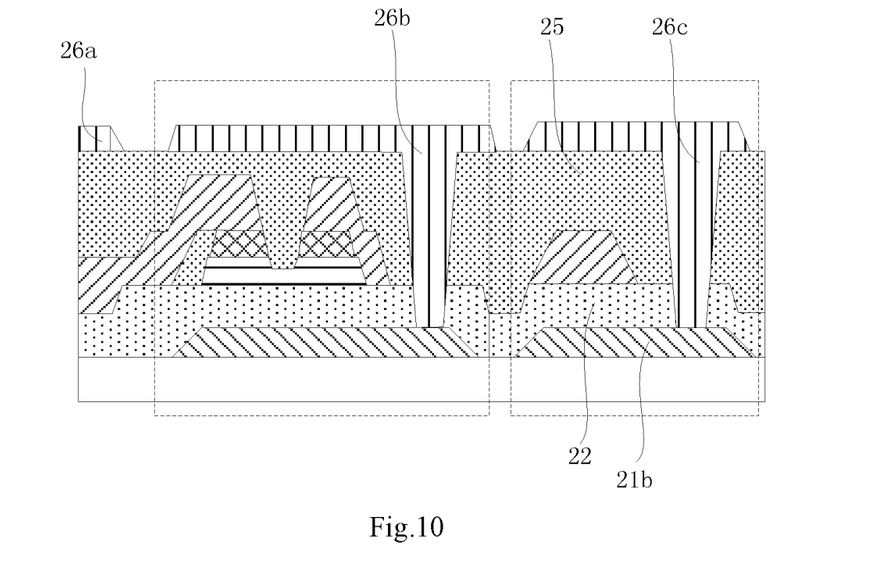
FIG. 10 is a schematic view of the array substrate in FIG. 9.

As shown in FIGS. 9 and 10, the step S33 further includes the sub-steps:

In the sub-step S331, forming a first contact hole passing through the source/drain electrode layer on the second insulation layer and forming a second contact hole reaching the first gate electrode layer via the first insulation layer and the second insulation layer.

In the sub-step S332: respectively depositing the transparent metallic layer on the first contact hole and the second contact hole to form the pixel electrode layer and the second gate electrode layer.

The step S33 further includes: forming an opening on the second insulation layer 25 by the yellow rays and forming a partial contact hole. The transparent metal, i.e., ITO, may be deposited on the second insulation layer 25 to form the anode of OLED, and the pixel electrode layer 26a, the second gate electrode layer 26b, and the third metallic layer 26c being spaced apart from each other. The third metallic layer 26c connects to the first metallic layer 21b via the third contact hole passing through the first insulation layer 22 and the second insulation layer 25.

As shown in FIG. 10, the second gate electrode layer 26b connects to the first gate electrode layer 11 via the through hole passing through the first insulation layer 12 and the second insulation layer 15 to form the TFT having the dual-gate structure, which enhances the driving forces of the array substrate.

Referring to FIGS. 8 and 10, the third metallic layer 26c connects to the first metallic layer 21b via the third contact hole passing through the first insulation layer 22 and the second insulation layer 25. The second metallic layer 24b overlaps with the first insulation layer 22 and the second insulation layer 25 respectively arranged on two sides of the second metallic layer 24b to form the capacitors connected in parallel. At the same time, the first insulation layer 22 respectively overlaps with the second metallic layer 24b and the first metallic layer 21b to form the third capacitor. The third capacitor and the above capacitors connected in parallel cooperatively form the three-layers capacitors connected in parallel. In this way, while the additional manufacturing process is not necessary, the storing capability of the capacitor is increased. Further, the dimension of the capacitor is reduced, which increases the aperture rate.

Further, forming a PDL layer OLED layer and a cathode on the second insulation layer 25, the pixel electrode layer 26a, the second gate electrode layer 26b, and the third metallic layer 26c in sequence to obtain the TFT substrate.

In other embodiment, the above method may be adopted to form the array substrate in FIG. 1 or 2.

The present disclosure also includes a display device includes any one of the above array substrate, or the array substrate manufactured by any one of the above methods. Further, the display device may be Active-matrix organic light emitting diode (AMOLED) or TFT LCD. By configuring the pixel electrode layer, the second gate electrode layer, and the third metallic layer on the second insulation layer on the second insulation layer, the second gate electrode layer, the first gate electrode layer, and the source/drain electrode layer form the TFT having the dual-gate structure, which increases the driving force of the AMOLED. At the same time, the third metallic layer, the first metallic layer, and the second metallic layer cooperatively form the three-layer capacitors connected in parallel. The storing capability of the capacitor is increased. Further, the dimension of the capacitor is reduced, which increases the aperture rate.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A display device, comprising:
an array substrate comprising:
a substrate, and a first gate electrode layer, a first insulation layer, a trench layer, a source/drain electrode layer, a second insulation layer, a pixel electrode layer and a second gate electrode layer formed on the substrate in sequence, and the pixel electrode layer and the second gate electrode layer being spaced apart from each other, wherein the source and the drain electrode layer are directly formed on the trench layer;
wherein the second gate electrode layer, the first gate electrode layer, and the source/drain electrode layer form at least one thin film transistor (TFT) having a dual-gate structure;
the second gate electrode layer directly connecting to the first gate electrode layer via through holes of the first insulation layer and the second insulation layer;
the trench layer comprising a semiconductor layer and a P-type silicon-doped layer.

2. The display device as claimed in claim 1, wherein:
the semiconductor layer is formed on the first insulation layer, and the semiconductor layer comprises a first semiconductor layer and a second semiconductor layer, a first side of the first semiconductor layer connects with a first side of the second semiconductor layer facing toward the first insulation layer, and a second side of the first semiconductor layer and a second side of the second semiconductor layer are spaced apart from each other;
the P-type silicon-doped layer is formed on the semiconductor layer, and the P-type silicon-doped layer comprises a first P-type silicon-doped layer and a second P-type silicon-doped layer spaced apart from each other, the first P-type silicon-doped layer covers the first semiconductor layer, and the second P-type silicon-doped covers the second semiconductor layer.

3. The display device as claimed in claim 1, wherein the array substrate further comprises:
a first metallic layer is formed on the substrate, and covered with the first insulation layer;
a second metallic layer is formed on the first insulation layer, and is covered with the second insulation layer;
a third metallic layer is formed on the second insulation layer, and the third metallic layer connects to the first metallic layer via the first insulation layer and the second insulation layer;
the second metallic layer, the second metallic layer, and the third metallic layer formed three-layer capacitors connected in parallel.

4. The display device as claimed in claim 1, wherein the display device is an Active-matrix organic light emitting diode (AMOLED) or TFT liquid crystal device (LCD).

5. An array substrate, comprising:
a substrate;
a first gate electrode layer covered the substrate;
a first insulation layer covered the first gate electrode layer;
a trench layer formed on the first insulation layer;
a source/drain electrode layer directly formed on the trench layer;
a second insulation layer covered the first insulation layer, the source/drain electrode layer and the trench layer;
a pixel electrode layer and the second gate electrode layer being configured to be spaced apart from each other on the second insulation layer;
wherein the second gate electrode layer, the first gate electrode layer, and the source/drain electrode layer form at least one thin film transistor (TFT) having a dual-gate structure.

6. The array substrate as claimed in claim 5, wherein the second gate electrode layer directly connecting to the first gate electrode layer via through holes of the first insulation layer and the second insulation layer.

7. The array substrate as claimed in claim 5, wherein the trench layer comprises a semiconductor layer and a P-type silicon-doped layer;
the semiconductor layer is formed on the first insulation layer, and the semiconductor layer comprises a first semiconductor layer and a second semiconductor layer, a first side of the first semiconductor layer connects with a first side of the second semiconductor layer facing toward the first insulation layer, and a second side of the first semiconductor layer and a second side of the second semiconductor layer are spaced apart from each other;
the P-type silicon-doped layer is formed on the semiconductor layer, and the P-type silicon-doped layer comprises a first P-type silicon-doped layer and a second P-type silicon-doped layer spaced apart from each other, the first P-type silicon-doped layer covers the first semiconductor layer, and the second P-type silicon-doped covers the second semiconductor layer.

8. The array substrate as claimed in claim 5, wherein the array substrate further comprises:
- a first metallic layer is formed on the substrate, and covered with the first insulation layer;
- a second metallic layer is formed on the first insulation layer, and is covered with the second insulation layer;
- a third metallic layer is formed on the second insulation layer, and the third metallic layer connects to the first metallic layer via the first insulation layer and the second insulation layer;
- the second metallic layer, the second metallic layer, and the third metallic layer formed three-layer capacitors connected in parallel.

9. A manufacturing method of array substrates, comprising:
- forming a first gate electrode layer and a first insulation layer on a substrate in sequence;
- forming a trench layer on the first insulation layer;
- forming a source/drain electrode layer directly on the trench layer, and a second insulation layer on the trench layer in sequence;
- forming a pixel electrode layer and a second gate electrode layer on the second insulation layer, the pixel electrode layer and the second gate electrode layer are spaced apart from each other,
- wherein the second gate electrode layer, the first gate electrode layer, and the source/drain electrode layer form at least one thin film transistor (TFT) having the dual-gate structure.

10. The method as claimed in claim 9, wherein the step of forming the pixel electrode layer and the second gate electrode layer on the second insulation layer further comprises:
- forming a first contact hole passing through the source/drain electrode layer on the second insulation layer and forming a second contact hole reaching the first gate electrode layer via the first insulation layer and the second insulation layer; and
- respectively depositing a transparent metallic layer on the first contact hole and the second contact hole to form the pixel electrode layer and the second gate electrode layer, wherein the second gate electrode layer directly connecting to the first gate electrode layer.

11. The method as claimed in claim 9, wherein forming the first gate electrode layer and the first insulation layer on the substrate further comprises:
- forming a gate electrode layer and a first metallic layer on a substrate;
- depositing silicon dioxide and/or silicon nitride on the substrate, the first gate electrode layer, and the first metallic layer to form the first insulation layer;
- wherein the step of forming the source/drain electrode layer and the second insulation layer on the trench layer in sequence further comprises:
- forming the source/drain electrode layer on the trench layer in sequence, and forming the second metallic layer on the first insulation layer;
- forming the second insulation layer on the trench layer, the source/drain electrode layer, and the second metallic layer;
- wherein the step of forming the pixel electrode layer and the second gate electrode layer on the second insulation layer further comprises:
- forming the pixel electrode layer, the second gate electrode layer, and the third metallic layer on the second insulation layer, wherein the pixel electrode layer, the second gate electrode layer, and the third metallic layer are spaced apart from each other, the third metallic layer connects to the first metallic layer via the third contact hole passing through the first insulation layer and the second insulation layer.

12. The method as claimed in claim 9, wherein forming the trench layer on the first insulation layer further comprises:
- depositing an amorphous silicon layer on the first insulation layer;
- forming a boron-doped amorphous silicon layer on the amorphous silicon layer by plasma chemical vapor deposition;
- converting the amorphous silicon layer converted into a polysilicon layer by a rapid thermal annealing method to obtain a semiconductor layer;
- converting the boron-doped amorphous silicon layer into a boron-doped polysilicon layer to obtain a P-type silicon doped layer;
- applying a complete trench etching process to the P-type silicon doped layer; and
- applying a partial trench etching process to the semiconductor layer.

* * * * *